United States Patent [19]

Nishimura et al.

[11] Patent Number: 5,060,035
[45] Date of Patent: Oct. 22, 1991

[54] SILICON-ON-INSULATOR METAL OXIDE SEMICONDUCTOR DEVICE HAVING CONDUCTIVE SIDEWALL STRUCTURE

[75] Inventors: Tadashi Nishimura; Tsuyoshi Yamano, both of Hyogo, Japan

[73] Assignee: Mitsubishi Denki Kabushiki Kaisha, Tokyo, Japan

[21] Appl. No.: 550,584

[22] Filed: Jul. 10, 1990

[30] Foreign Application Priority Data

Jul. 13, 1989 [JP] Japan .................................. 1-180952
May 23, 1990 [JP] Japan .................................. 2-133001

[51] Int. Cl.$^5$ ..................... H01L 27/01; H01L 27/02; H01L 29/10; H01L 29/04
[52] U.S. Cl. .................................... 357/23.7; 357/42; 357/23.3; 357/59
[58] Field of Search .................. 357/23.7, 42, 23.3

[56] References Cited

U.S. PATENT DOCUMENTS 4,753,896 6/1988 Matloubian ........................ 357/23.7
4,969,023 11/1990 Svedberg .......................... 357/23.7

FOREIGN PATENT DOCUMENTS 59-181670 10/1984 Japan .
61-13661 1/1986 Japan ................................. 357/23.7
62-298162 12/1987 Japan .

OTHER PUBLICATIONS

Electronics Letters, Oct. 8, 1987, vol. 23, No. 21, pp. 1162-1164.

Electronics Letters, Aug. 31, 1978, vol. 14, No. 18, pp. 593-594.

*Primary Examiner*—Rolf Hille
*Assistant Examiner*—Robert P. Limanek
*Attorney, Agent, or Firm*—Lowe, Price, LeBlanc and Becker

[57] ABSTRACT

A field effect transistor comprises source, drain and channel regions in a semiconductor layer formed on an insulating substrate. An island-shaped semiconductor layer of a first conductivity type is formed on a major surface of the insulating substrate and isolated from the surroundings. Source and drain regions of a second conductivity type are formed spaced apart from each other in the island-shaped semiconductor layer so as to define the channel region having a part of a major surface of the island-shaped semiconductor layer as a channel surface. A gate electrode is formed on the channel surface through an insulating film. A sidewall insulating film is formed on a sidewall of other region than the source region in the island-shaped semiconductor layer. A semiconductor sidewall layer of the first conductivity type is formed on a sidewall of the island-shaped semiconductor layer corresponding to the source region and the sidewall insulating film. Potentials of the source region and the semiconductor sidewall layer are held the same. A sidewall leakage current due to a parasitic MOS transistor is reduced. A potential barrier near an end portion of the source region is stabilized and reduction of a breakdown voltage between the source and drain can be prevented. A SOI-MOS transistor having stable electrical characteristics can be obtained.

10 Claims, 9 Drawing Sheets

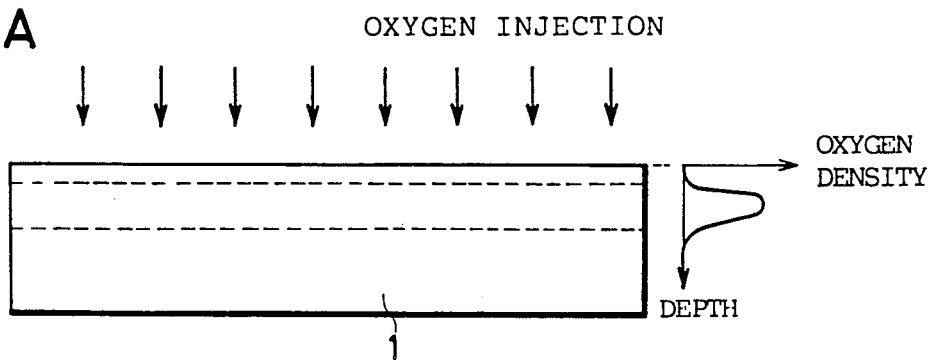
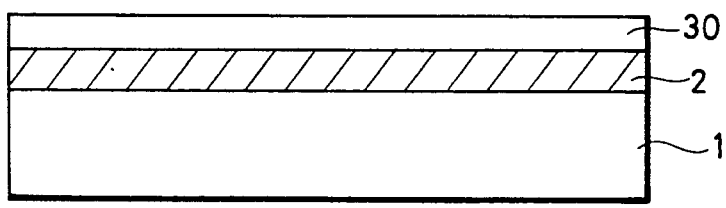
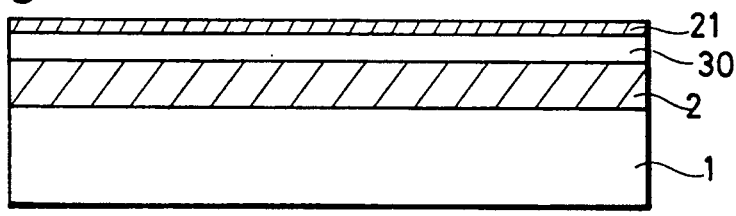
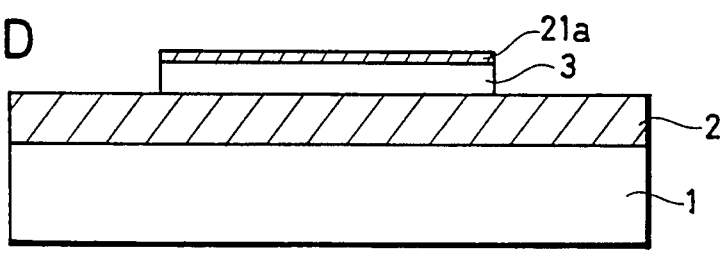
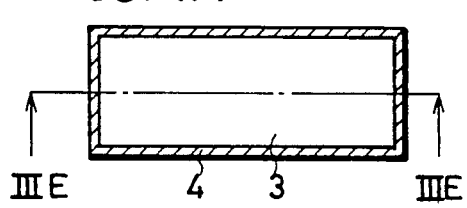
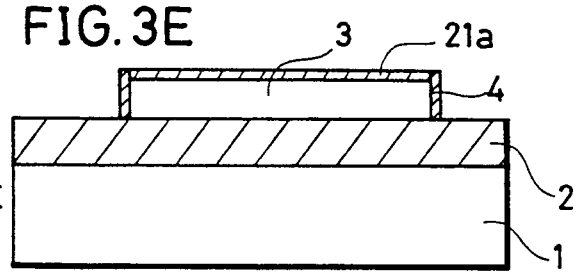

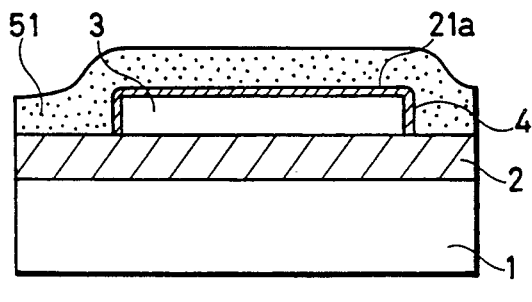
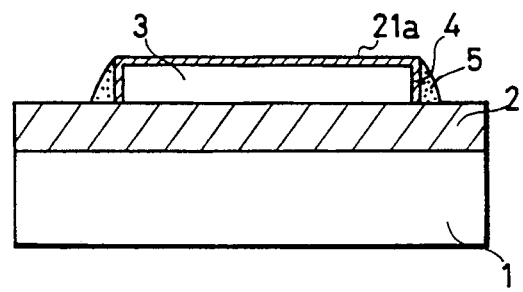
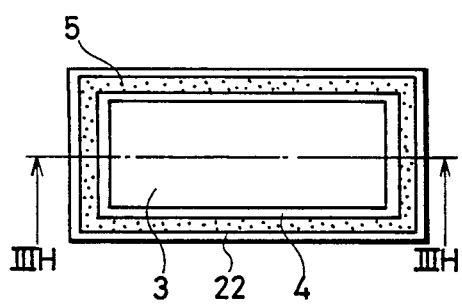
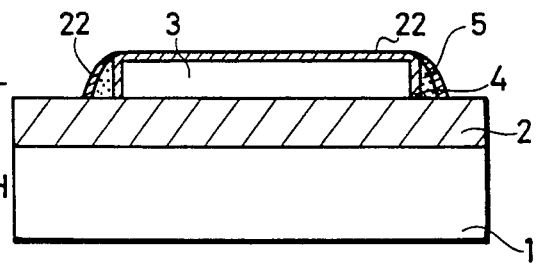
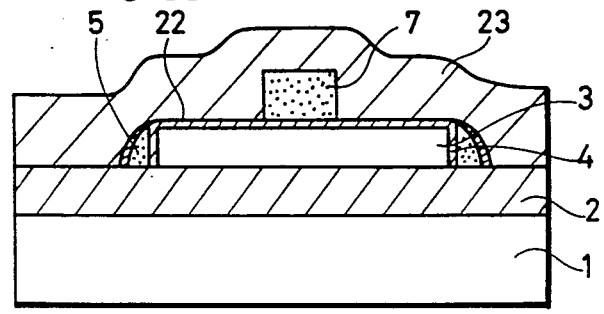
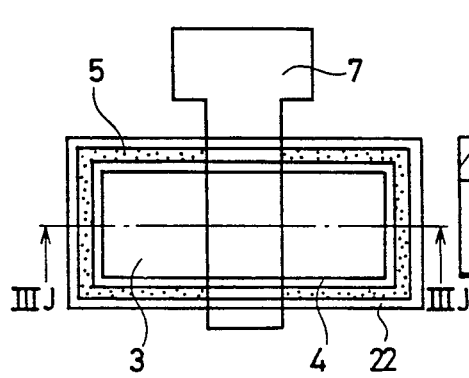
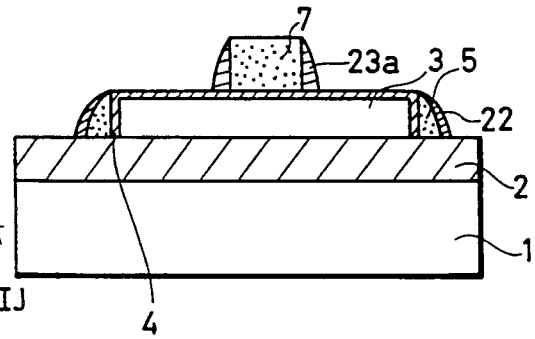

N-channel MOSFET/SOI $V_{th}$

P $V_G$ (V)

SILICON-ON-INSULATOR METAL OXIDE SEMICONDUCTOR DEVICE HAVING CONDUCTIVE SIDEWALL STRUCTURE

BACKGROUND OF THE INVENTION

1. Field of the Invention

The present invention relates generally to silicon-on-insulator metal-oxide-semiconductor (SOI-MOS) devices and manufacturing method thereof and, more particularly to such devices having a novel sidewall structure to improve operating characteristics thereof.

2. Description of the Background Art

Generally, a field effect transistor with source and drain regions formed on a surface of such semiconductor substrate as silicon is referred to as a bulk MOS. Another structure of a field effect transistor is a SOI-MOS structure in which source, drain and channel regions are formed in a silicon thin film on an insulating substrate such as sapphire or an insulating thin film.

The bulk MOS has the following drawbacks as compared with the SOI-MOS. First, in the CMOS structure, an n type substrate region or an n type well of a pMOS and a p type substrate region or a p type well of an nMOS form a pn junction, there exist parasitic bipolar transistors. In this case, two bipolar transistors of pnp and npn exist to form a parasitic pnpn thyristor. Therefore, there occurs a phenomenon that the thyristor remains conductive and is not restored due to an effect such as an external noise, that is, latch-up is generated. A distance between the pMOS and nMOS can not be made too short because in order to prevent the latch-up, gains of the bipolar transistors forming the parasitic pnpn thyristor should be reduced. Accordingly, with the bulk MOS structure, integration density of a transistor has its limit.

In addition, in the bulk MOS structure, all of the source and drain regions have pn junctions formed between the same and substrates or wells. Therefore, the parasitic capacitance by the pn junction is a disadvantageous factor in a high speed operation of the transistor.

FIG. 7 is a sectional view showing a conventional general SOI-MOS. Referring to FIG. 7, a SOI-MOS comprises, for example, an island-shaped p-type semiconductor layer 3 having an insulated periphery on an insulating substrate 2 of sapphire or the like. An n+ source region 31 and an n+ drain region 32 isolated from each other are provided in the semiconductor layer 3 so as to reach an interface between the semiconductor layer 3 and the insulating substrate 2. A gate electrode 7 of polycrystalline silicon or the like is provided on a channel region 33 between the source and drain regions 31 and 32 through a gate oxide film 6.

Thus, in a SOI-MOS structure, perfect isolation among transistors is possible. With a CMOS (Complementary Metal Oxide Semiconductor) structure, even if an n-type region and a p-type region is close, generation of latch-up is prevented and parasitic capacitance is reduced so that if a highly reliable semiconductor device is provided, which has attracted attention. Recently, a principal is known that if a thickness of a silicon layer formed on an insulating substrate becomes below 0.1 μm, characteristics such as a current drivability capability and short-channel effect are improved due to a fully depleted channel region. This is reported in a published paper by J. P. Colinge et al. entitled "CMOS circuits made in thin SIMOX films" in Electronics letters vol. 23 pp. 1162–1164 (1987). Therefore, the SOI-MOS is expected as a basic structure of a transistor of submicron order.

In order to practically obtain the above described characteristics, each SOI-MOS transistor can be isolated by LOCOS (Local Oxidation of Silicon) method or mesa-type isolation method.

FIG. 8 is a partially sectional view showing a structure of a SOI-MOS transistor isolated by the LOCOS method. Referring to FIG. 8, an insulating layer 2 is formed on a silicon substrate 1. A single-crystalline silicon layer 3 is formed on the isolating layer 2. A thick isolating oxide film 40 is formed on the single-crystalline silicon layer 3 so as to isolate active regions spaced apart from each other. A source region 31, a drain region 32 and a channel region 33 are formed in the single-crystalline silicon layer 3 as an active region. A gate electrode 7 is formed on the channel region 33 through a gate oxide film 6. An aluminum interconnection layer 10 is formed on respective surfaces of the source region 31, the gate electrode 7 and the drain region 32. The isolated structure by the LOCOS method is not suitable for isolation of the elements of a miniaturized SOI-MOS since the isolating oxide film 40 extends greatly in lateral direction to form sometimes called a bird's beak.

FIG. 9 is a partially sectional view showing a SOI-MOS having its elements isolated by the mesa-type isolation method. Referring to FIG. 9, single-crystalline silicon layers 3 separated from each other are formed on an insulating layer 2. An interlayer insulating film 9 fills up spaces between these single-crystalline layers 3 through a thin insulating film 4 so as to isolate each single-crystalline silicon layer 3. A source region 31, a drain region 32 and a channel region 33 are formed in the single-crystalline silicon layer 3. A gate electrode 7 is formed on the channel region 33 through a gate oxide film 6. An aluminum interconnection layer 10 is formed on respective surfaces of the source region 31, the drain region 32 and the gate electrode 7. Such a mesa-type isolated structure can be precisely processed according to a resist pattern using a photolithography technique. Therefore, the mesa-type isolation method is suitable for a method of isolating more and more miniaturized SOI-MOS transistors. However, with the mesa-type isolation method, as shown in FIG. 10, a parasitic MOS transistor can be formed on a sidewall or a corner portion 3a, 3b of the single-crystalline silicon layers 3.

FIG. 10 is a partially sectional view perpendicular to the section shown in FIG. 9, and a partially sectional view showing a section in a direction along to a channel width. A single-crystalline silicon layer 3 is formed into an island-shaped configuration so as to extrude from an insulating layer 2. Thus, a gate electrode 7 is formed through a gate oxide film 6 not only on an upper surface but on side surfaces of the single-crystalline silicon layer 3. At this time, when a voltage is applied to the gate electrode 7, a parasitic MOS transistor is formed on the side surfaces 3a and 3b along a direction of a channel length of the single-crystalline silicon layer 3.

As described above, when a parasitic MOS transistor is formed, characteristics of drain current-gate voltage become defective within the range shown by P as shown in FIG. 11. This is caused by the fact that formation of a parasitic MOS transistor on a sidewall surface of the single-crystalline silicon layer causes a leak current to flow between a source and a drain at a relatively low gate voltage. In order to resolve the problem, a threshold voltage $V_{th}$ of normal transistor should be made larger by increasing impurity concentration of a whole channel region 3c in FIG. 10 and the like. However, increased threshold voltage $V_{th}$ causes a reduction of an effective voltage {=(supplied voltage)−(threshold voltage)}, which in turn requires a reduction of drain current of a SOI-MOS transistor.

A structure of a SOI-MOS transistor directed to solve the above described problem is disclosed in Japanese Patent Laying Open No. 62-298162. FIG. 12 is a partial plan view showing a plane arrangement of the SOI-MOS disclosed in the above described official gazette, FIG. 13 is a partially sectional showing a section taken along a line XIII—XIII in FIG. 12. Referring to FIGS. 12 and 13, a single-crystalline silicon layer 3 is formed on an insulating substrate 2. A gate oxide film 6 is formed on an upper surface of the single-crystalline silicon layer 3, and thin insulating film 4 is formed on a side surface of the single-crystalline layer 3. A polycrystalline silicon layer 52 in which a p-type impurity is introduced is formed on a periphery of the single-crystalline silicon layer 3 so as to surround it through the insulating film 4. An insulating film 61 is formed on an outer surface of the polycrystalline silicon layer 52. A gate electrode 7 extends over the gate oxide film 6 and the insulating film 61. The gate electrode 7 is connected to a interconnection layer 71. A source region 31 and a drain region 32 are formed in the p-type single-crystalline silicon layer 3 by introduction of n-type impurity. The source region 31 and the p-type single-crystalline silicon layer 52 are connected to an interconnection layer 10 through a contact hole 11, whereby potentials of the source region 31 and the polycrystalline silicon layer 52 are held the same. The drain region 32 is connected to an interconnection layer 10 through a contact hole 12. According to the above described structure, since a potential of the p-type polycrystalline silicon layer 52 formed on the sidewall of the single-crystalline silicon layer 3 is held the same as that of the source region 31, the side surface of the single-crystalline silicon layer 3 is never converted to be an inversion layer nor depletion layer. Therefore, a leakage current between the source and drain flowing through the side surface along the direction of a channel length can be prevented.

On the other hand, another structure of the SOI-MOS transistor directed to prevent a leak current of the sidewall as in the foregoing is disclosed in Japanese Patent Laying-Open No. 59-181670. FIG. 14 is a partial plan view showing a plane arrangement of the SOI-MOS transistor as disclosed, FIG. 15 is a partially sectional view taken along a line XV—XV in FIG. 14, and FIG. 16 is a partially sectional view taken along a line XVI—XVI in FIG. 14. Referring to FIGS. 15 and 16, a single-crystalline silicon layer 3 is formed on an insulating substrate 2. A source region 31 and a drain region 32 of n+ impurity regions are formed in the single-crystalline silicon layer 3 as shown in FIGS. 14 and 16. A gate electrode 7 is formed on a channel region 33 through a gate oxide film 6 as shown in FIGS. 15 and 16. A polycrystalline silicon layer 52 in which p-type impurity is introduced is formed on a sidewall of the single-crystalline silicon layer 3 through insulating film 4 as shown in FIGS. 14 and 15. Referring to FIG. 16, an aluminum interconnection layer 10 is connected to the source region 31 and the drain region 32 through contact holes formed in an interlayer insulating film 9. In this structure, in order to hold potentials of the source region 31 and the polycrystalline silicon layer 52 the same, concaves 4a are formed in the thin insulating film 4 as shown in FIG. 14. The source region 31 and the polycrystalline silicon layer 52 are connected through the concaves 4a.

However, even if a leak current generated on the sidewall can be reduced as described above, the following problems shown in FIG. 17 cannot be resolved.

As a SOI-MOS transistor is miniaturized, increase of a drain voltage causes an electric field in a channel direction to become significantly large near the drain especially in a short channel MOS transistor. As a result, electrons (ⓐ in FIG. 17) injected from source region in the channel region are accelerated by the strong electric field to easily enter a high energy state. The high energy electrons collide with silicon atoms near end portions of the drain region, whereby a greater number of pairs of electron and hole are generated as shown in FIG. 17. Among the electrons and holes generated by the impact ionization (ⓑ in FIG. 17) as described above, electrons are attracted to a higher drain electric field to flow into the drain region and becomes a part of a drain current. The holes are drawn back inversely by the drain electric field to flow into a depletion layer under the channel region or the source region (ⓒ in FIG. 17). Such phenomenon is observed not only in a short-channel MOS transistor but also in a relatively long-channel MOS transistor. Especially in the short-channel MOS transistor, overwhelmingly large number of pairs of electron-hole are generated as compared in the long-channel MOS transistor.

When the holes thus generated by impact ionization flow into the depletion layer under the channel region, the holes cause potentials near the channel region and the source region to rise so that a height of a potential barrier is lowered. When the potential barrier near the source region is lowered, a lot of electrons are implanted from the source region into a substrate region or the channel region, thereby impact ionization becomes more and more active, so that more pairs of electron and hole are generated. The generated holes cause the potential barrier near the source region to be lowered furthermore and the electrons implanted from the source region to be more and more increased. Thus, the MOS transistor finally breaks down.

Since in the SOI-MOS structure, a MOS transistor is formed on an insulating substrate or film, a substrate region of the MOS transistor is floated. Therefore, as described above, as the drain voltage is increased, holes (in case of nMOS among pairs of electron and hole generated by the impact ionization of channel carriers stay in the substrate region and bias the same to be positive, thereby dropping the threshold voltage, resulting in the sudden increase of the drain currents. A potential of the substrate region of the SOI-MOS transistor is made unstable in this way. This phenomena is referred to as a substrate floating effect. In addition, the above described impact ionization is generated also near the end portion of the drain region due to a small amount of the leak current between the source and drain.

SUMMARY OF THE INVENTION

One object of the present invention is to stabilize electrical characteristics of a transistor in a SOI-MOS transistor.

Another object of the present invention is to reduce sidewall leakage currents caused by a parasitic MOS transistor in a SOI-MOS transistor.

A further object of the present invention is to stabilize a potential barrier near an end portion of a source region and prevent the reduction of a breakdown voltage between source and drain in a SOI-MOS transistor.

A still further object of the present invention is to prevent a substrate floating effect in a SOI-MOS transistor.

A still further object of the present invention is to structure a CMOS inverter by using a SOI-MOS transistor having stable electrical characteristics.

A still further object of the present invention is to manufacture a semiconductor device comprising a SOI-MOS transistor which electrical characteristics can be stabilized.

A still further object of the present invention is to manufacture a SOI-MOS transistor in which sidewall leakage current caused by a parasitic MOS transistor can be reduced.

A still further object of the present invention is to manufacture a SOI-MOS transistor in which a potential barrier near an end portion of a source region can be stabilized and reduction of a breakdown voltage between source and drain can be prevented.

A still further object of the present invention is to manufacture a SOI-MOS transistor in which a substrate floating effect can be prevented.

A semiconductor device comprising a field effect transistor having source, drain and channel regions in a semiconductor layer formed on an insulating substrate according to the present invention comprises an insulating substrate, an island-shaped semiconductor layer of a first conductivity type, source and drain regions of a second conductivity type, a gate electrode, a sidewall insulating film, and a semiconductor sidewall layer of the first conductivity type. The island-shaped semiconductor layer of the first conductivity type is formed on a major surface of the insulating substrate, has a major surface and a sidewall, and is isolated from the surroundings. The source and drain regions of the second conductivity type are formed spaced apart from each other in the island-shaped semiconductor layer so as to define the channel region having a part of the major surface of the island-shaped semiconductor layer as its channel surface. The gate electrode is formed on the channel surface through the insulating film. The sidewall insulating film is formed on a sidewall in a region other than the source region of the island-shaped semiconductor layer. The semiconductor sidewall layer of the first conductivity type is formed on a sidewall of the island-shaped semiconductor layer corresponding to the source region and the sidewall insulating film. Potentials of the source region and the semiconductor sidewall layer are held the same.

According to a manufacturing method of a semiconductor device, first formed on a major surface of an insulating substrate is an island-shaped semiconductor layer of a first conductivity type having a major surface and a sidewall, and isolated from the surroundings. A gate insulating film is formed on the major surface of the island-shaped semiconductor layer and a sidewall insulating film is formed on the sidewall of the same. A semiconductor sidewall layer of the first conductivity type is formed on the sidewall insulating film. A gate electrode is formed on the gate insulating film. As a result, a pair of regions are formed spaced apart from each other with the gate electrode provided therebetween in the island-shaped semiconductor layer. The sidewall insulating film positioned between the sidewall of the island-shaped semiconductor layer corresponding to one of the pair of regions and the semiconductor sidewall layer is selectively removed. A semiconductor layer is formed to fill and connect between the sidewall of the island-shaped semiconductor layer corresponding to the one region and the semiconductor sidewall layer. A source region is formed in the one region and a drain region is formed in the other region by selectively doping impurities of a second conductivity type in the island-shaped semiconductor layer, using the gate electrode as a mask.

In the present invention, a potential of the semiconductor sidewall layer surrounding the island-shaped semiconductor layer is held the same as that of the source region, a potential of the sidewall surface of the island-shaped semiconductor layer is fixed by the semiconductor sidewall layer. Therefore, even if a voltage is applied to the gate electrode, inversion of the sidewall surface of the island-shaped semiconductor layer at a lower voltage than the threshold voltage can be prevented. Thereby, a leak current due to a parasitic MOS transistor formed on the sidewall surface of the island-shaped semiconductor layer is reduced.

In addition, impact ionization is generated near the end portion of the drain region also due to a small amount of a leak current between the source and the drain. The impact ionization causes the holes to diffuse under the channel region. In the present invention, however, the semiconductor sidewall layer of the first conductivity type directly connected to the source region is formed. The semiconductor sidewall layer of the first conductivity type has an interface provided between the semiconductor sidewall layer and a region near the end portion of the channel region. Therefore, the generated holes are taken out into the semiconductor sidewall layer of the first conductivity type through the interface. As a result, a potential near the end portion of the source region is fixed and characteristics of the SOI-MOS transistor become extremely stable.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A, 3B, 3C, 3D, 3E, 3F, 3G, 3H, 3I, 3J, 3K, 3L, 3M and 3N are partially sectional views showing sequential steps of a method of manufacturing the SOI-MOS transistor according to the present invention.

FIG. 4A is a plan view corresponding to FIG. 3E.
FIG. 4B is a plan view corresponding to FIG. 3H.
FIG. 4C is a plan view corresponding to FIG. 3J.

DESCRIPTION OF THE PREFERRED EMBODIMENTS

One embodiment of the present invention will be described in reference to the drawings in the following.

Figure 1:
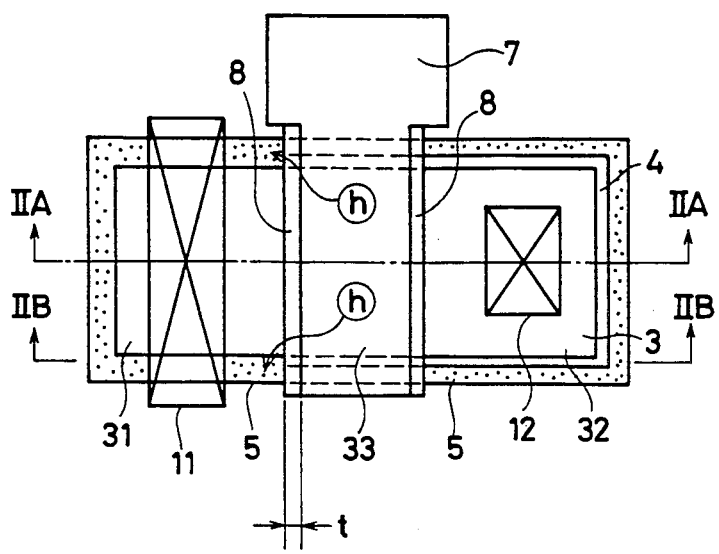
FIG. 1 is a plan view showing a plane arrangement of a SOI-MOS transistor according to the present invention.
Figure 2A:
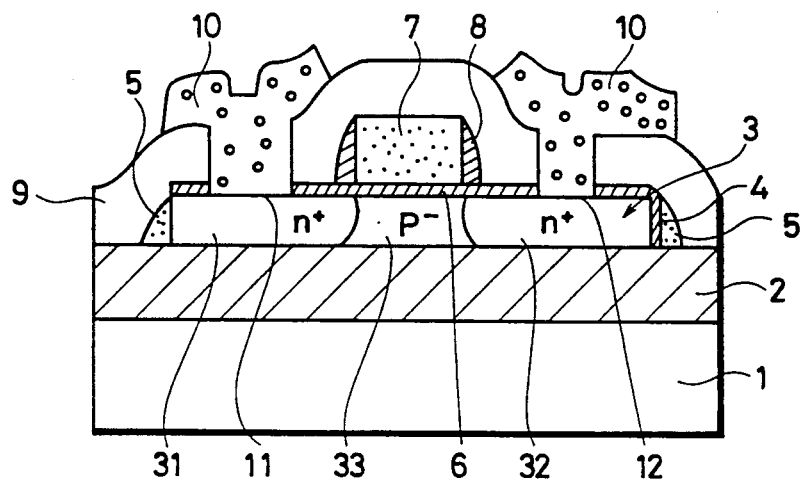
FIG. 2A is a sectional view taken along a line IIA—IIA in FIG. 1.
Figure 2C:
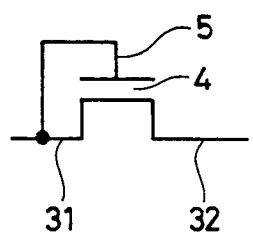
FIG. 2C is an equivalent circuit diagram showing a parasitic MOS transistor cut off in accordance with the present invention.
Figure 2B:
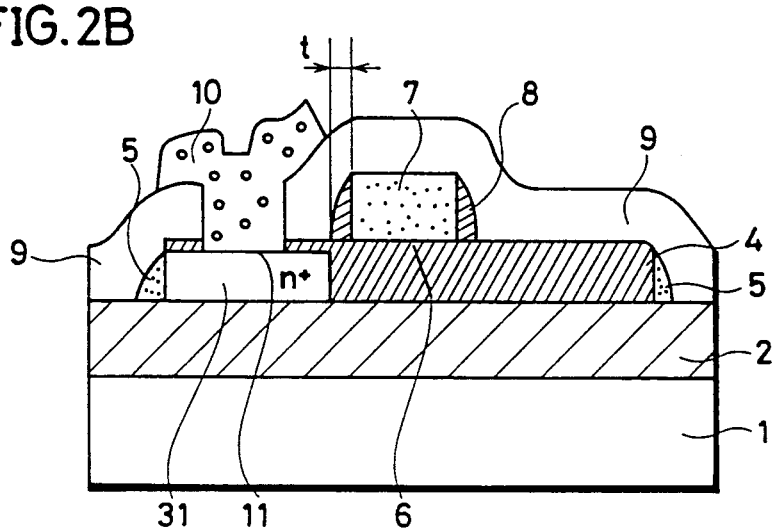
FIG. 2B is a sectional view taken along a line IIB—IIB in FIG. 1.

Referring to FIGS. 1, 2A and 2B, an insulating layer 2, for example, of silicon oxide layer is formed on a p-type silicon substrate 1. A p-type single-crystalline silicon island 3 is formed on the insulating layer 2. A source region 31 and a drain region 32 of n+ impurity regions are formed in the single-crystalline silicon island 3. A channel region 33 is formed between the source region 31 and the drain region 32. A gate electrode 7 is formed on the channel region 33 through a gate oxide film 6, the gate electrode having, for example, polycrystalline silicon layer, or two-layered structure of polycrystalline silicon layer and high melting point metal silicide layer. A thin insulating film 4 of, for example, silicon oxide film is formed on a sidewall of the single-crystalline silicon island 3. A polycrystalline silicon layer 5 into which p+ type impurity is doped is formed on an outer side of the sidewall of the single-crystalline silicon island 3. The polycrystalline silicon layer 5 is directly formed on a sidewall surface of the source region 31. The polycrystalline silicon layer 5 is formed on the sidewall of the single-crystalline silicon island 3 excluding the source region 31, through the insulating film 4. A sidewall 8 of silicon oxide film is formed as spacer on the sidewall of the gate electrode 7.

As shown in FIGS. 1 and 2B, the insulating film 4 is formed to extend from the side surface of the gate electrode 7 toward the source region 31 by a width t of the sidewall 8. The width t of the sidewall 8 is set in the range from 0.1 μm to 0.2 μm. If t is less than 0.1 μm, the gate insulating film might be damaged. This is possible because if t exceeds 0.2 μm, no contact interface can be formed between the neighbor of the end portion of the channel region 33 and the p+ polycrystalline silicon layer 5 (p+ impurity diffusion region). This is related to a function of extracting the holes flowing under the channel region which will be described later.

An interlayer insulating film 9 of silicon oxide film or the like formed by low temperature chemical vapor deposition (CVD) method is formed on the single-crystalline silicon island 3. Contact holes 11 and 12 are formed in the interlayer insulating film 9. The contact holes 11 is formed such that surfaces of the source region 31 and the polycrystalline silicon layer 5 are simultaneously exposed. Potentials of the source region 31 and the polycrystalline silicon layer 5 are held the same by forming an aluminum interconnection layer 10 through the contact hole 11. The drain region 32 is connected to the aluminum interconnection layer 10 through the contact hole 12.

In the above described structure, a parasitic MOS structure is found wherein a thin insulating film 4 is used as a gate oxide film and the p+ polycrystalline silicon layer 5 as a gate electrode in the sidewall portion of the single-crystalline silicon island 3 as shown in FIG. 2C. In the parasitic MOS structure, however, a portion to be the gate electrode 5 is of p type and a potential of the portion to be the gate electrode is held the same as that of the source region 31. The potential is basically regarded as a ground potential. Therefore, the sidewall portion of the single-crystalline silicon island 3 is never converted to be an inversion layer nor depletion layer. Accordingly, a parasitic MOS transistor formed of the source region and the drain region, and having the above described MOS structure is always in an OFF state. As a result, no sidewall leak current flowing between the source and drain occurs. Thereby, in the SOI-MOS transistor shown in FIG. 1 and FIG. 2A, only a transistor using the major surface of the single-crystalline silicon island 3 as a channel surface contributes to performance of electrical characteristics.

Figure 17:
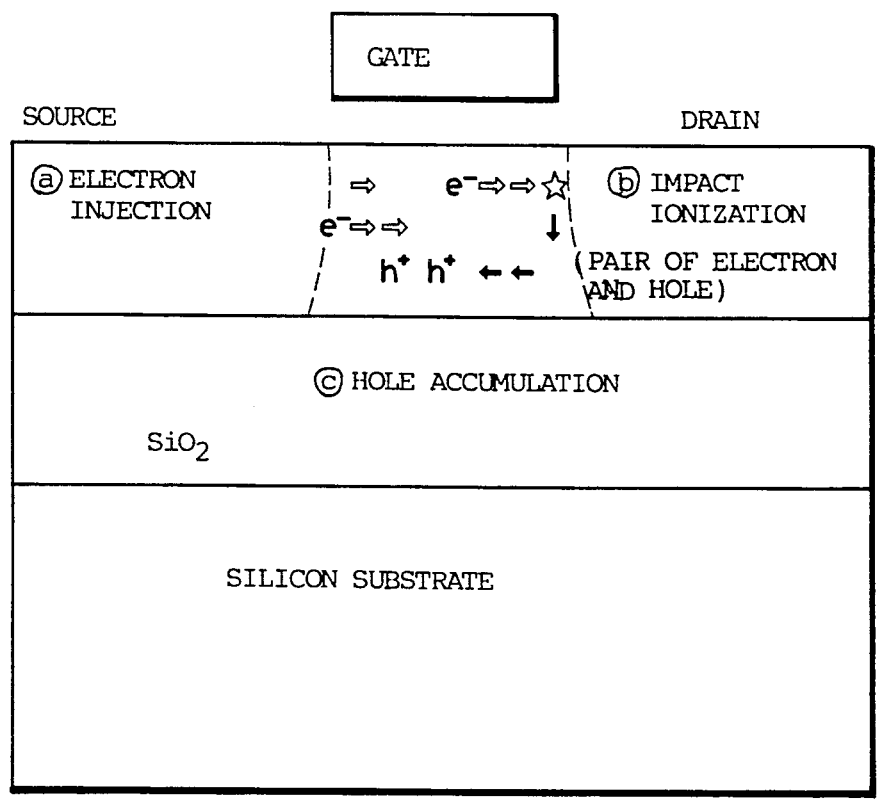
FIG. 17 is a schematically sectional view showing breakdown mechanism by impact ionization in a conventional SOI-MOS transistor.

In addition, in the SOI-MOS transistor of the present invention, even if generation of a small amount of leak current causes impact ionization, potentials of the substrate region or near the end portion of the source region never become unstable. For example, assuming that generation of a small amount of leak current causes impact ionization near the end portion of the drain region 32, then the holes are diffused under the channel region 33, similarly to ⓒ shown in FIG. 17. The holes ⓒ thus flowing under the channel region, as indicated by ⓒ ⓗ in FIG. 1, are taken out into the p+ polycrystalline silicon layer 5 having an interface near the end portion of the channel region 33. Therefore, a potential near the end portion of the source region 31 is fixed and reduction of a breakdown voltage between the source and drain can be prevented.

Hence, according to the above described two characteristics, the SOI-MOS transistor of the present invention demonstrate extremely stable electrical characteristics.

Now, one example of a manufacturing method of a SOI-MOS transistor according to the present invention will be described. FIGS. 3A through 3M are partially sectional views showing sequential steps of manufacturing the SOI-MOS transistor of the present invention.

Referring to FIG. 3A, oxygen ions are injected under an acceleration voltage of 200KeV on a surface of a p⁻ type silicon substrate 1 (17-20Ωcm) having a plane direction of a major surface (100). A vertical diffusion of oxygen concentration at this time is shown in FIG. 3A. Injection amount is $1.8 \times 10^{18} - 2.0 \times 10^{18}/cm^2$.

Referring to FIG. 3B, anneal process is performed in nitrogen atmosphere at a temperature of 1350° C. for 60 minutes, thereby forming an insulating layers 2 of silicon oxide layer having a thickness of 5000Å embedded to a predetermined depths from a surface of the silicon substrate 1. A single-crystalline silicon layer 30 of a thickness of 2,500Å is formed in a surface portion. Thus, a method for forming a silicon oxide layer directly in the silicon substrate, as described above, is referred to as SIMOX (Separation by Implanted Oxygen) method. The SIMOX method is described in a published paper by K. Izumi et al; Electron. Lett., 14 (1978) 593. "CMOS Devices Fabricated on Buried SiO₂ Layers Formed by Oxygen Implantation into Silicon".

Referring to FIG. 3C, an oxide film 21 of a thickness of 500Å is formed on a surface the single-crystalline silicon layer 30.

As shown in FIG. 3D, a single-crystalline silicon island 3 and an oxide film 21a are etched into an island-shape.

Referring to FIGS. 3E and 4A, a thin insulating film 4 is formed by oxidizing sidewall surfaces of the single-crystalline silicon island 3.

As shown in FIG. 3F, a polycrystalline silicon layer 30 of a film thickness of 2000-3000Å is formed by the conventional low pressure chemical vapor deposition method (LPCVD method). The LPCVD method is one type of the film forming methods, which is for forming a film under a lower pressure. This film forming method is excellent in the evenness of a film thickness and the productivity. Thereafter, a desired conductivity type impurity is doped in the polycrystalline silicon layer. In this case, high concentration boron as a p type impurity is doped in the polycrystalline silicon layer in order to form an n channel MOS field effect transistor. In this way, a p+ polysilicon layer 51 is formed.

The polycrystalline silicon layer 51 is selectively removed using an etchback technique by reactive ion etching method (RIE) method to be left only on the sidewall of the single-crystalline silicon island 3 as shown in FIG. 3G. After the removal of the oxide film 21a by wet etching, an oxide film 22 of a film thickness of 100-150Å is formed over the whole surface of the single-crystalline silicon island 3. Thus, the structure shown in FIG. 3H and FIG. 4B is obtained.

As shown in FIG. 3I, a gate electrode 7 made of polycrystalline silicon or the like is formed. A silicon oxide film 23 is deposited over the whole surface by CVD method.

Referring to FIG. 3J and FIG. 4C, the silicon oxide film 23 is selectively removed using an etchback technique by RIE method, thus the silicon oxide film 23a is formed only on the sidewall of the gate electrode 7.

Figure 4D:
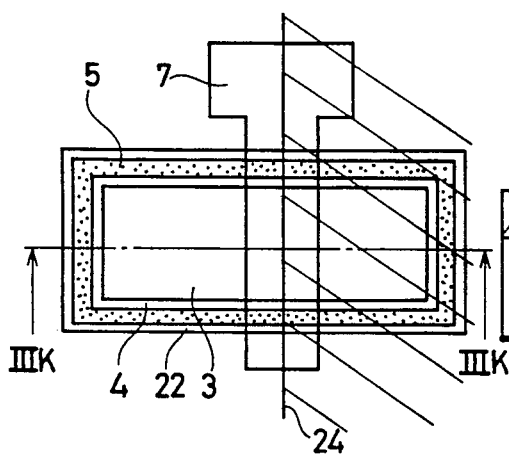
FIG. 4D is a plan view corresponding to FIG. 3K.
Figure 3K:
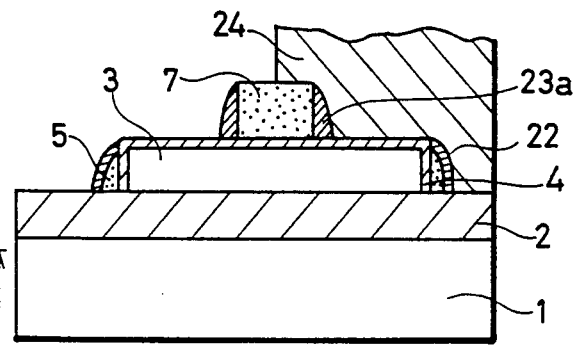

Referring to FIG. 3K and FIG. 4D, the drain region side of the gate electrode 7 is covered with a resist 24 as a mask.

Figure 3L:
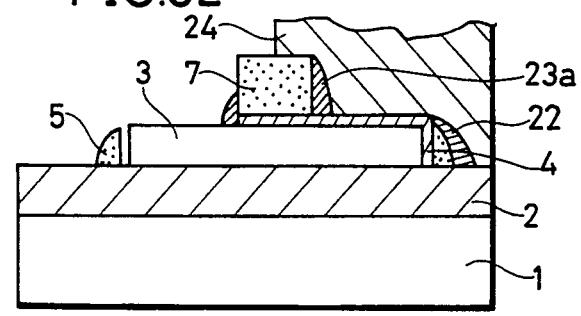

Referring to FIG. 3L, the oxide film 22 on the source region side is removed by wet etching using the resist 24 as the mask. At the same time, the insulating film 4 on the source region side is removed.

Figure 3M:
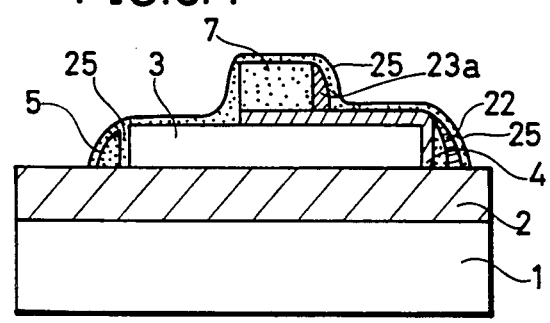

As shown in FIG. 3M, after the removal of the resist 24, the silicon is grown to a very thin thickness by a CVD method. Thereby, a thin silicon layer 25 is formed over the whole surface so as to fill a region from which the insulating film 4 is removed, that is, a space between the polycrystalline silicon layer 5 on the source region side and the single-crystalline silicon island 3.

Figure 4E:
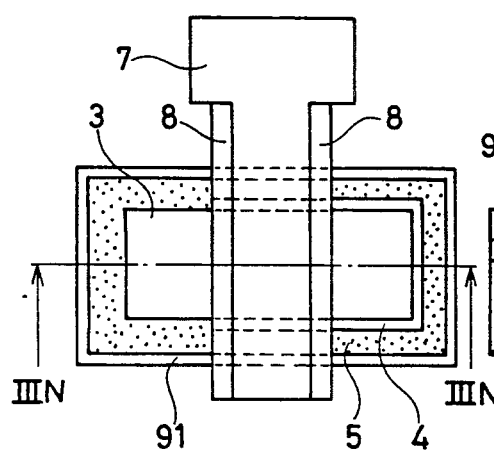
FIG. 4E is a plan view corresponding to FIG. 3N.
Figure 3N:
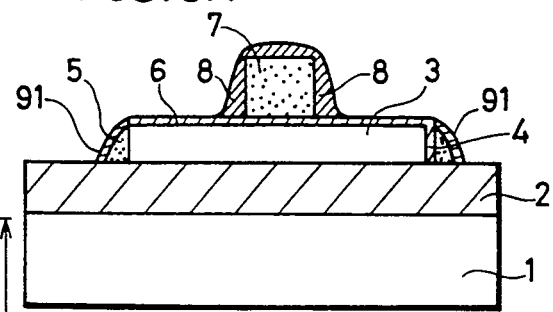

Referring to FIG. 3N and FIG. 4E, a silicon layer formed so as to connect the source region and the gate electrode 7 is oxidized by having its whole surface being oxidized, and the gate electrode and the source region are isolated. At the same time, an oxide film is also formed on a surface of the polycrystalline silicon layer 5 formed on the sidewall of the single-crystalline silicon island 3. Thereby, an oxide film 91 being a part of the interlayer insulating film and a sidewall 8 are formed.

Thereafter, an n type impurity is introduced into the single-crystalline silicon island 3 using the gate electrode 7 as a mask, so that the source region 31 and the drain region 32 are formed as shown in FIG. 2. After the formation of an interlayer insulating film 9, the aluminum interconnection layer 10 is connected to the source region 31 and the drain region 32 through the contact holes 11 and 12.

Thus, the SOI-MOS transistor according to the present invention is completed.

Figure 5:
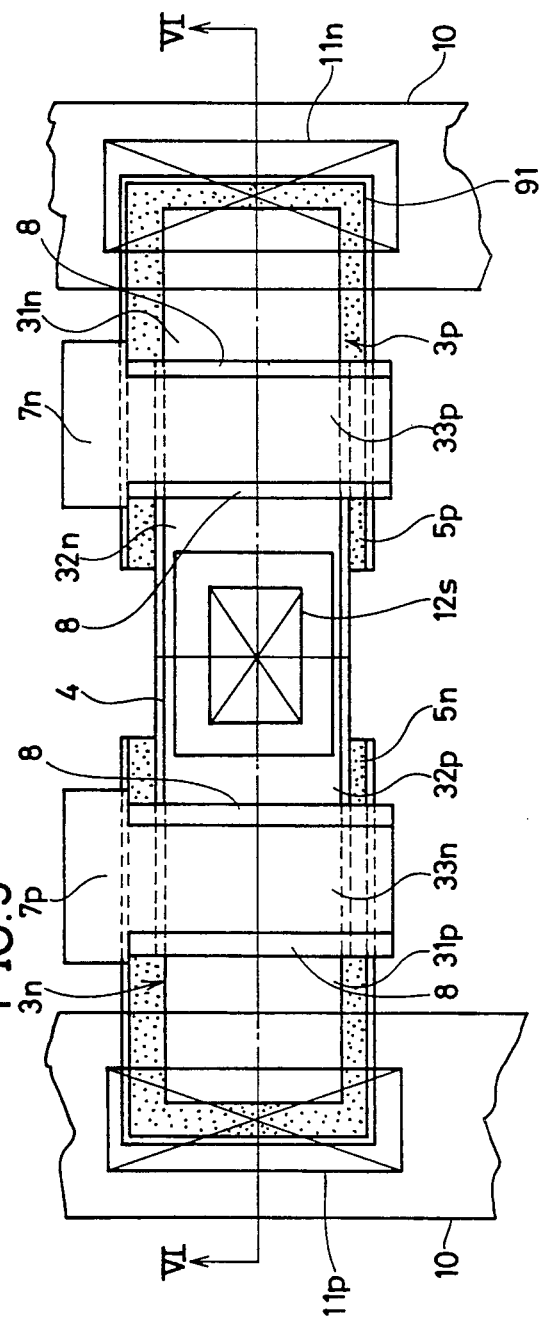
FIG. 5 is a partial plan view showing a plane arrangement of a CMOS inverter structured by the SOI-MOS transistor according to the present invention.
Figure 6:
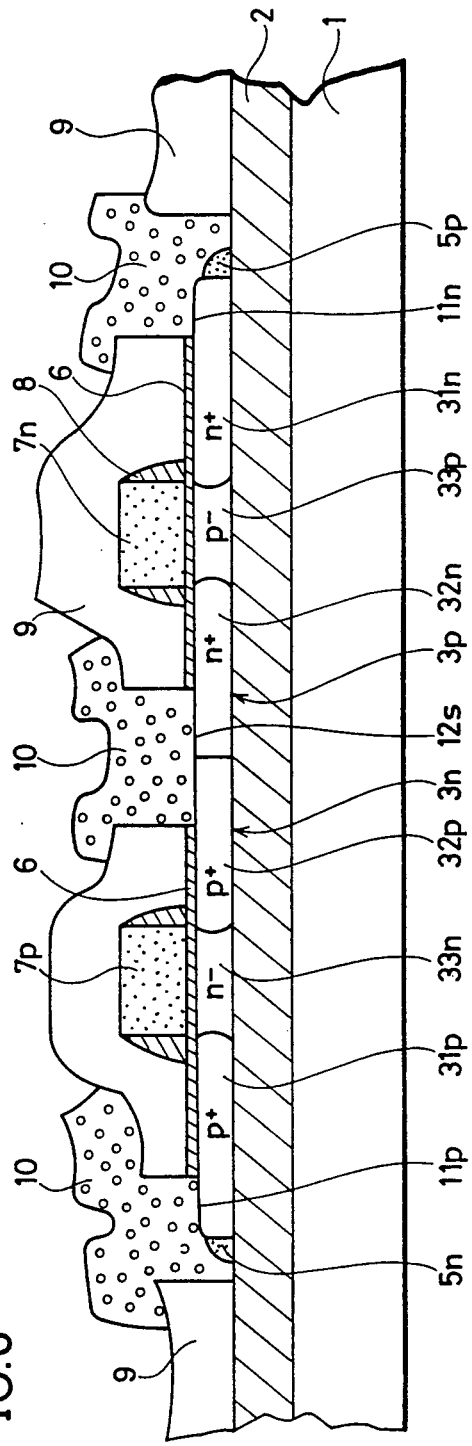
FIG. 6 is a partially sectional view taken along a line VI—VI in FIG. 5.
Figure 7:
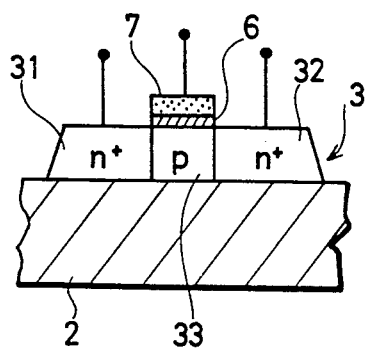
FIG. 7 is a partially sectional view showing a conventional SOI-MOS transistor.
Figure 12:
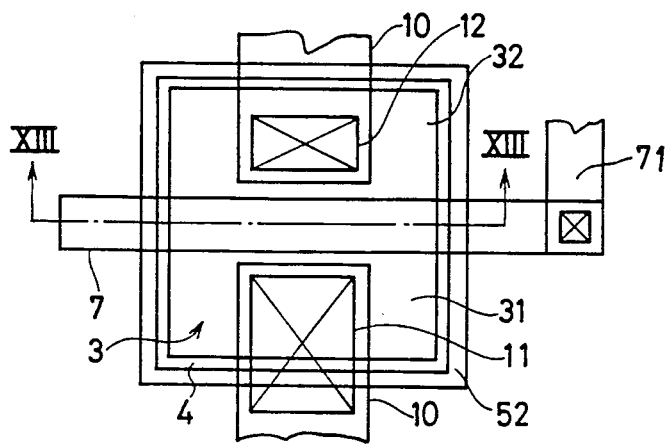
FIG. 12 is a partial plan view showing a conventional improved SOI-MOS transistor.
Figure 10:
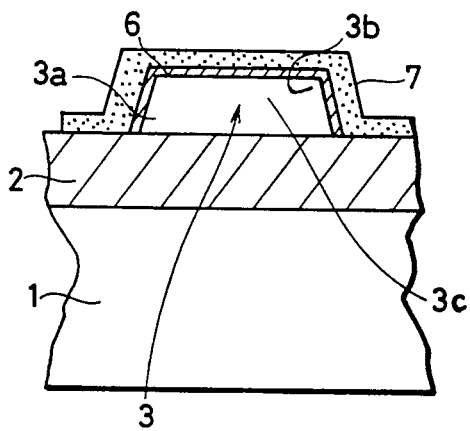
FIG. 10 is a partially sectional view showing a section taken along a channel width of the SOI-MOS transistor shown in FIG. 9.
Figure 13:
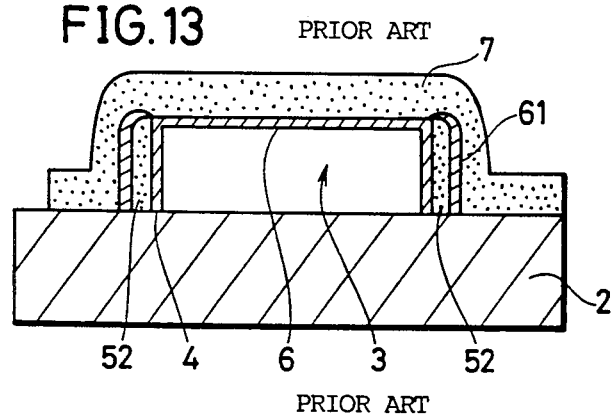
FIG. 13 is a partially sectional view taken along a line XIII—XIII in FIG. 12.
Figure 14:
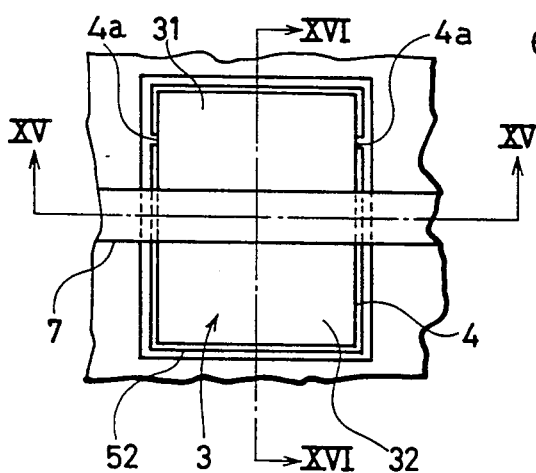
FIG. 14 is a partial plan view showing another conventional improved SOI-MOS transistor.
Figure 15:
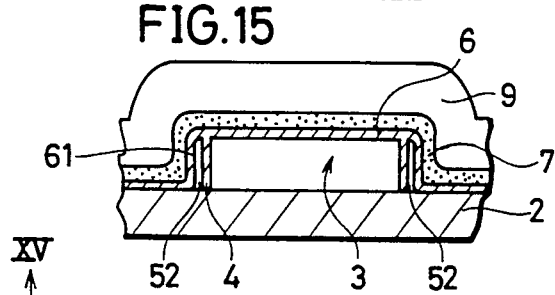
FIG. 15 is partially sectional view taken along a line XV—XV in FIG. 14.
Figure 16:
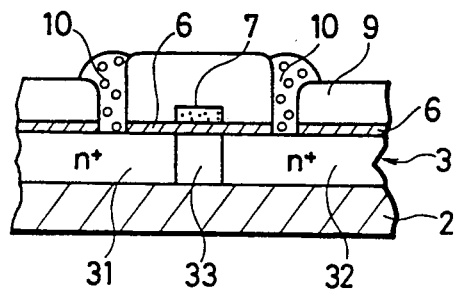
FIG. 16 is a partially sectional view taken along a line XVI—XVI in FIG. 14.
Figure 8:
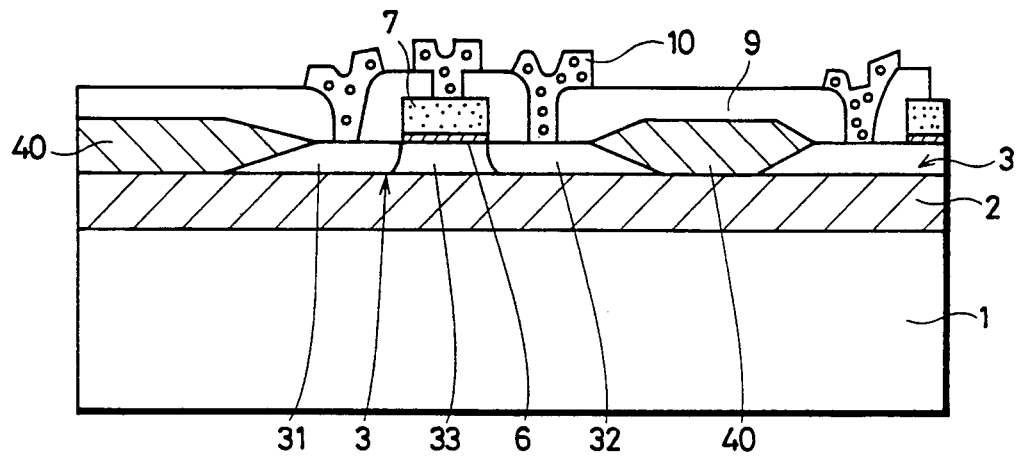
FIG. 8 is a partially sectional view showing a conventional SOI-MOS transistor whose elements are isolated by the LOCOS method.
Figure 9:
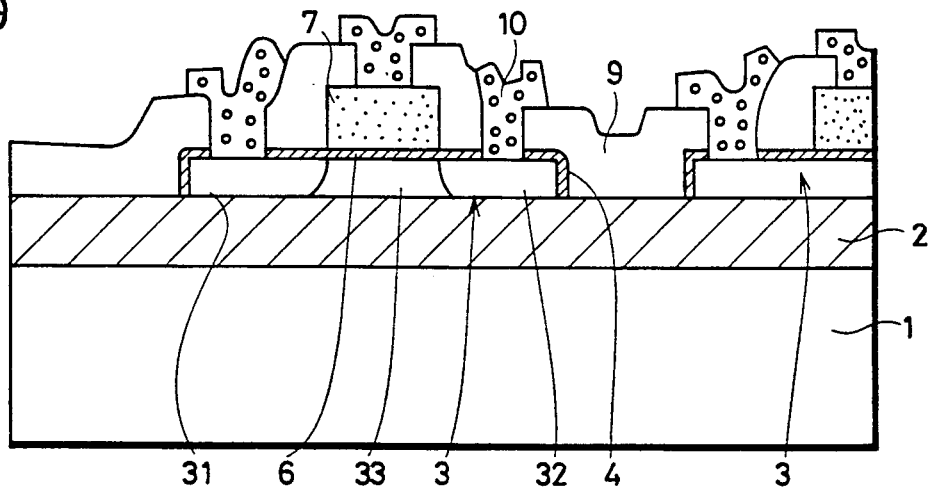
FIG. 9 is a partially sectional view showing a conventional SOI-MOS transistor whose elements are isolated by the mesa isolation method.
Figure 11:
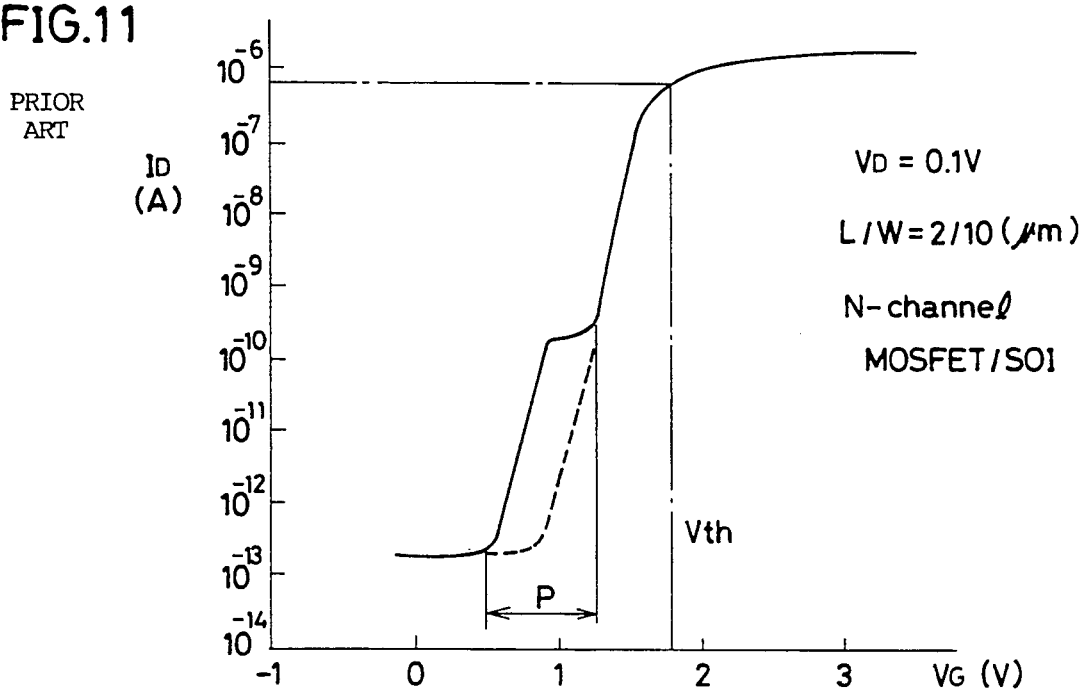
FIG. 11 is a graph showing characteristics of drain current-gate voltage of a conventional SOI-MOS transistor.

FIG. 5 is a partial plan view showing a CMOS inverter structured by the SOI-MOS transistor of the present invention, FIG. 6 is partially sectional view showing a section taken along a line VI—VI in FIG. 5. Referring to these figures, a structure of a CMOS inverter formed of SOI-MOS transistors according to the present invention will be described.

An insulating layer 2 is formed on a silicon substrate 1. An n type single-crystalline silicon layer 3n and a p type single-crystalline silicon layer 3p are formed on the insulating layer 2. A p channel MOS transistor is formed in the single-crystalline silicon layer 3n. An n channel MOS transistor is formed in the single-crystalline silicon layer 3p. A source region 31p, a drain region 32p and a channel region 33n are formed in the n type single-crystalline silicon layer 3n. A source region 31n, a drain region 32n and a channel region 33p are formed in the p type single-crystalline silicon layer 3p. The two single-crystalline silicon layers 3p and 3n are arranged such that the drain region 32p of the p channel MOS transistor and the drain region 32n of the n channel MOS transistor are in contact with each other.

The drain regions 32p and 32n are connected to an aluminum interconnection layer 10 through a shared contact 12s. The source region 31p is connected to an aluminum interconnection layer 10 through a contact hole 11p and its potential is held to a power supply potential. The source region 31n is connected to an aluminum interconnection layer 10 through a contact hole 11n and its potential is held to a ground potential. A gate electrode 7p is formed on the channel region 33n through a gate oxide film 6. A gate electrode 7n is formed on the channel region 33p through the gate oxide film 6. Interlayer insulating films 9 are formed between respective aluminum interconnection layers.

Polycrystalline silicon layers 5n and 5p are formed in the periphery of the respective single-crystalline silicon layers 3n and 3p. The polycrystalline silicon layer 5n in which the n type impurity is doped is formed on a sidewall surface of the single-crystalline silicon layer 3n in which a p channel MOS transistor is formed. On the other hand, the polycrystalline silicon layer 5p in which the p type impurity is doped is formed on a sidewall surface of the single-crystalline silicon layer 3p in which an n channel MOS transistor is formed. A thin insulating film 4 is formed on the sidewall surfaces of the single-crystalline silicon islands 3n and 3p excluding respective source regions 31p and 31n.

After the formation of a non-doped polycrystalline silicon layer 51 in a step shown in FIG. 3F, doping of n type or p type impurities is performed by ion implantation using a mask in each region of the polycrystalline silicon layer 5n and 5p to have different conductivity types from each other. In this doping, a portion where two drain regions 32p of the p channel MOS transistor and 32n of the n channel MOS transistor are in contact with each other should not strictly isolated into an n type region and a p type region. It is in a polycrystalline silicon layer formed on the sidewall surfaces of the source regions 31p and 31n and the channel regions 33n and 33p that the polycrystalline silicon layers 5n and 5p should have the n conductivity type region and the p conductivity type region which are isolated from each other. Therefore, as the foregoing, the n type region and the p type region should not be isolated where two drain regions are in contact with each other. In other words, a margin region for mask alignment in implanting ions of n type or p type impurities can be obtained where the two drain regions are in contact with each other.

Thus, the SOI-MOS transistor according to the present invention is applicable to a CMOS inverter.

Figure 18:
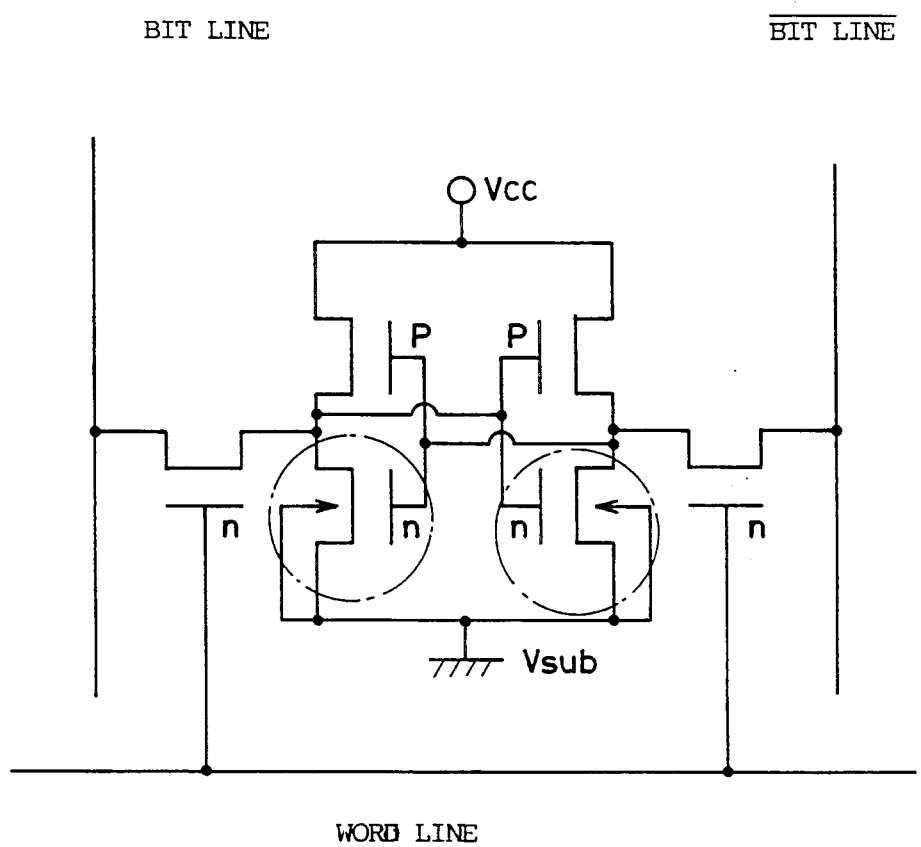
FIG. 18 is an equivalent circuit diagram showing a static random access memory cell to which the SOI-MOS transistor according to the present invention is applicable.

In addition, the SOI-MOS transistor according to the present invention can be applied to a CMOS inverter forming a static random access memory (SRAM). Referring to FIG. 18, the SOI-MOS transistor according to the present invention is used for two n channel MOS transistors surrounded by a chain dotted line in one memory cell.

As the foregoing, according to the present invention, a SOI-MOS transistor in which sidewall leak currents due to a parasitic MOS transistor can be reduced can be obtained. In addition, since a potential barrier near the end portion of the source region and a potential of the substrate region can be stabilized, a semiconductor device can be provided comprising a SOI-MOS transistor in which reduction of a breakdown voltage between the source and drain can be prevented. Accordingly, the electronical characteristics of the SOI-MOS transistor become highly stable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an insulating substrate having a major surface,
   an island-shaped semiconductor layer of a first conductivity type formed on the major surface of said insulating substrate, having a major surface and a sidewall at eh periphery of said major surface of said island-shaped semiconductor layer, and isolated from any surrounding structures,
   source and drain regions of a second conductivity type formed spaced apart from each other in said island-shaped semiconductor layer so as to define a channel region having a part of the major surface of said island-shaped semiconductor layer as a channel surface,
   a gate electrode formed on said channel surface through an insulating film,
   a sidewall insulating film formed on a sidewall along said periphery enclosing all of said island-shaped semiconductor layer other than said source region,
   a semiconductor sidewall layer of the first conductivity type formed on a sidewall of said island-shaped semiconductor layer corresponding to said source region and said sidewall insulating film,
   potentials of said source region and said semiconductor sidewall layer being held the same.

2. A semiconductor device according to claim 1, further comprising an interconnection layer for connecting both with said source region and with said semiconductor sidewall layer through a shared contact region.

3. A semiconductor device according to claim 1, wherein
   said insulating substrate comprises a silicon layer and a silicon oxide layer formed on said silicon layer.

4. A semiconductor device according to claim 1, wherein
   said island-shaped semiconductor layer is covered with a second insulating layer formed on said insulating substrate.

5. A semiconductor device according to claim 1, comprising an insulating film formed at least on a sidewall of said source region side of said gate electrode, said sidewall insulating film having an end portion extending on said source region side so as to connect with said insulating film.

6. A semiconductor device comprising:
   an insulating substrate having a major surface,
   a first island-shaped semiconductor layer of the first conductivity type and a second island-shaped semiconductor layer formed on the major surface of said insulating substrate, each having a major surface and a sidewall at the periphery of said major surface of each said island-shaped semiconductor layer and isolated from any surrounding structures,
   first source and drain regions of the second conductivity type formed spaced apart from each other in said first island-shaped semiconductor layer so as to define a first channel region having a part of the major surface of said first island-shaped semiconductor layer as a channel surface,
   a first gate electrode formed on said first channel surface through an insulating film,
   second source and drain regions of the first conductivity type formed spaced apart from each other in said second island-shaped semiconductor layer so as to define a second channel region having a part of the major surface of said second island-shaped semiconductor layer as a second channel surface,
   a second gate electrode formed on said second channel surface through an insulating film,
   the first island-shaped semiconductor layer and the second island-shaped semiconductor layer being arranged such that said first and second drain regions are in contact with each other,
   a first sidewall insulating film formed on a sidewall along said periphery of said major surface of said first island-shaped semiconductor layer enclosing all of said first island-shaped semiconductor layer other than said first source region and a region where said first and second drain regions contact each other and a second sidewall insulating film formed on a sidewall along said periphery of said major surface of said second island-shaped semiconductor layer enclosing all of said second island-shaped semiconductor layer other than said second surface region and said region where said first and second drain regions contact each other, a first semiconductor sidewall layer of the first conductivity type formed on a sidewall of said first island-shaped semiconductor layer corresponding to said first source region and said sidewall insulating film, a second semiconductor sidewall layer of the second conductivity type formed on a sidewall of said second island-shaped semiconductor layer corresponding to said second source region and said sidewall insulating film, potentials of said first source region and said first semiconductor sidewall layer being held to a first potential, and potentials of said second source region and said second semiconductor sidewall layer being held to a second potential.

7. A semiconductor device according to claim 6, further comprising an interconnection layer for connecting both with said first drain region and with said second drain region through a shared contact.

8. A semiconductor device according to claim 6, further comprising a first interconnection layer for connecting both with said first source region and with said first semiconductor sidewall layer through one shared contact region, and a second interconnection layer for connecting both with said second source region and with said second semiconductor sidewall layer through another shared contact region.

9. A semiconductor device according to claim 6, wherein
said insulating substrate comprises a silicon oxide layer formed on a silicon substrate.

10. A semiconductor device according to claim 6, wherein
said first and second island-shaped semiconductor layers are insulated by an additional insulating layer formed on said insulating substrate.

* * * * *